United States Patent [19]

van Tran

[11] Patent Number: 4,794,317

[45] Date of Patent: Dec. 27, 1988

[54] ECL-TO-CMOS LEVEL CONVERSION FOR USE IN ECL-BICMOS CIRCUIT

[75] Inventor: Hiep van Tran, Carrollton, Tex.

[73] Assignee: Texas Instruments Incorporated, Dallas, Tex.

[21] Appl. No.: 134,652

[22] Filed: Dec. 18, 1987

[51] Int. Cl.⁴ ............................................. G05F 3/20
[52] U.S. Cl. .................................... 323/316; 323/317; 307/446; 307/475
[58] Field of Search ............... 323/312, 313, 314, 315, 323/316, 317; 307/446, 455, 475, 576

[56] References Cited

U.S. PATENT DOCUMENTS

| | | | |
|---|---|---|---|
| 4,437,171 | 3/1984 | Hudson et al. | 307/475 |
| 4,453,095 | 6/1984 | Wrathall | 307/475 |
| 4,563,601 | 1/1986 | Asano et al. | 307/475 |
| 4,645,951 | 2/1987 | Uragami | 307/446 |
| 4,645,954 | 2/1987 | Schuster | 307/475 |
| 4,692,641 | 9/1987 | Highton | 323/316 |
| 4,697,109 | 9/1987 | Honma et al. | 307/446 |

Primary Examiner—Peter S. Wong
Attorney, Agent, or Firm—Rodney M. Anderson; Leo N. Heiting; Melvin Sharp

[57] ABSTRACT

A high-speed level shifter converts ECL logic levels to CMOS logic levels for use in an ECL BiCMOS circuit. A CMOS inverter (34) is connected to the output of an emitter coupled pair through a resistor (36). A current reference circuit ensures that the voltage drop across the resistor (36) is such to shift the ECL logic level to the trip point of the CMOS buffer.

20 Claims, 3 Drawing Sheets

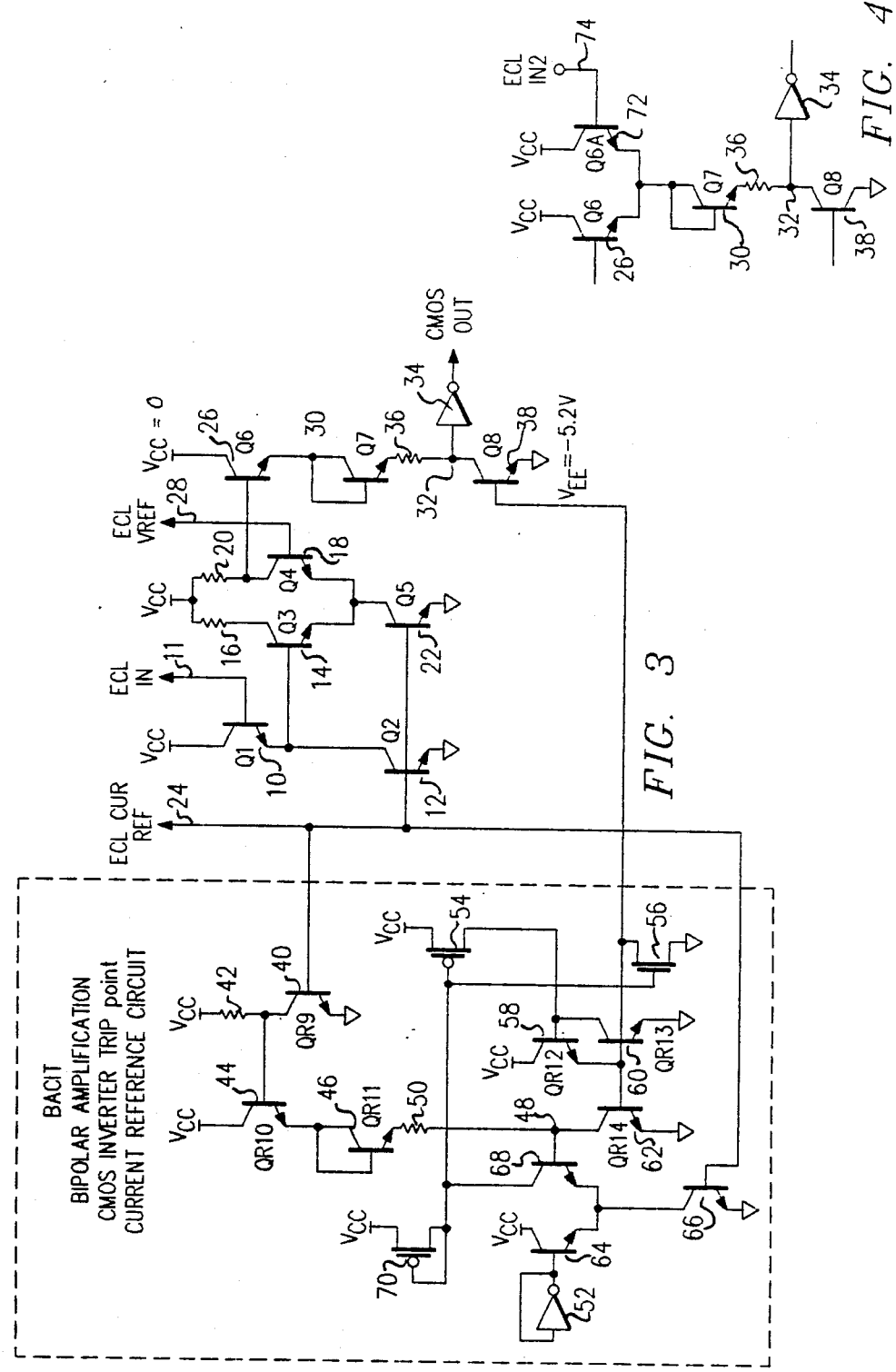

ECL-TO-CMOS LEVEL CONVERSION FOR USE IN ECL-BICMOS CIRCUIT

TECHNICAL FIELD OF THE INVENTION

This invention relates in general to integrated circuits, and more particularly to a high-speed voltage level translator to convert ECL logic levels to CMOS logic

BACKGROUND OF THE INVENTION

ECL-to-CMOS voltage level converters are used in digital design in order to allow a CMOS circuit to input data from an ECL circuit. Since the voltages corresponding to high and low logic levels are different for ECL and CMOS, the ECL input voltage must be shifted to a level which will be recognized by the CMOS. It is important for speed and noise margin considerations that the "trip point" of the CMOS, i.e., the voltage at which CMOS distinguishes between high and low logic levels, be centered with the transition between high and low ECL logic levels after the ECL voltage is shifted.

Prior art ECL-to-CMOS level shifters have the disadvantage of being slow, mainly due to the use of a CMOS current mirror differential pair used to pass signals from the ECL circuit to the CMOS circuit. Since speed is a primary advantage of ECL devices, the slowness of the voltage level shifter is a serious problem.

Therefore, a need has arisen in the industry to provide a ECL-to-CMOS level shifter having high speed and being compatible in a ECL-BiCMOS integrated circuit.

SUMMARY OF THE INVENTION

In accordance with the present invention, a ECL-to-CMOS level shifter method and apparatus is provided which substantially eliminates or prevents the disadvantages and problems associated with prior ECL-to-CMOS level shifters.

The ECL-to-CMOS level shifter of the present invention uses a CMOS converter coupled directed to an ECL buffer. A voltage drop across a resistor shifts the ECL logic levels down to the trip point of the CMOS inverter. The voltage drop across the resistor is set such that the trip point of the CMOS inverter is at half the voltage output of the ECL buffer. This ensures maximum noise margin and speed.

The present invention provides the technical advantage that the trip point of the CMOS inverter may be reliably set at the midpoint of the ECL voltage swing. Since the CMOS inverter is directly coupled to the ECL rather than through a CMOS current mirror, the speed of the circuit is greatly enhanced

BRIEF DESCRIPTION OF THE DRAWINGS

For a more complete understanding of the present invention and the advantages thereof, reference is now made to the following descriptions taken in conjunction with the accompanying drawings, in which:

FIG. 3 illustrates a second embodiment of the present invention;

FIG. 4 illustrates a circuit diagram of an embodiment wherein the circuits of FIGS. 1 and 3 may be used as an ECL NOR gate having a CMOS output.

DETAILED DESCRIPTION OF THE INVENTION

The preferred embodiment of the present invention is best understood by referring to FIGS. 1-6 of the drawings, like numerals being used for like and corresponding parts of the various drawings.

Figure 1:
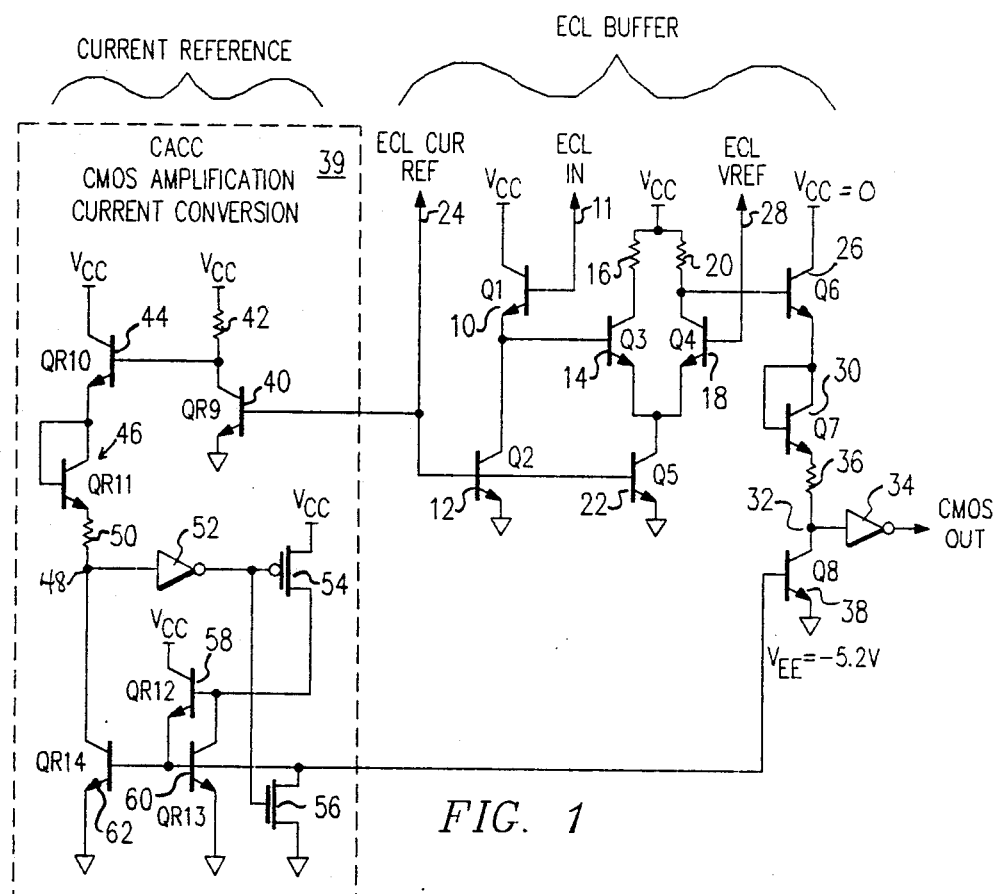
FIG. 1 illustrates a circuit diagram of a first embodiment of the ECL-to-CMOS level shifter of the present invention.

FIG. 1 illustrates a circuit diagram for a first embodiment of the ECL-to-CMOS voltage level shifter of the present invention. An ECL buffer comprises a first NPN transittor 10 having an ECL input 11 connected to its base, and $V_{cc}$ connected to its collector. For the ECL circuit, $V_{cc}$ equals 0 volts and ground ($V_{EE}$) equals $-5.2$ volts. The emitter of the NPN transistor 10 is connected to the collector of a second NPN transistor 12 and the base of a thidd NPN transistor 14. The collector of the third NPN transistor 14 has its collector connected to $V_{cc}$ through a resistor 16, having a value R. A fourth NPN transistor 18 also has its collector connected to $V_{cc}$ through a resistor 20 having a value of R. The emitters of the third and fourth NPN transistors 14 and 18 are connected to the collector of a fifth NPN transistor 22. The bases of the second and fifth transistors 12 and 22 are connected to an ECL current reference 24.

The collector of the fourth NPN transistor 18 is connected to the base of a sixth NPN transistor 26. The base of the fourth NPN transistor 18 is connected to an ECL voltage reference 28. The collector of the sixth NPN transistor 26 is connected to $V_{cc}$ and the emitter of the sixth NPN transistor 26 is connected to collector and base of a seventh NPN transistor 30. The emitter of the seventh NPN transistor 30 is connected to the CMOS input node 32 of a CMOS inverter 34 through a resistor 36. The input node 32 is also connected to the collector of an eighth NPN transistor 38 whose emitter is connected to ground.

A current reference 39 drives the base of the eighth NPN transistor 3B. The current reference 39 comprises a ninth NPN transistor 40 having its base connected to the ECL current reference 24 and its collector connected to $V_{cc}$ through a resistor 42 having a value of R/2. The emitter of the ninth NPN transistor 40 is connected to ground. The collector of the ninth NPN transistor 40 is also connected to the base of a tenth NPN transistor 44 having its collector connected to $V_{cc}$ and its emitter connected to the base and collector of an eleventh NPN transistor 46. The emitter of the eleventh NPN transistor 46 is connected to a node 48 through a resistor 50 having a value equal to the resistor 36. The node 48 is connected to the input of a CMOS inverter 52 whose output is connected to the gates of a P channel transistor 54 and a N channel transistor 56. The source of the P channel transistor 54 is connected to $V_{cc}$ and the drain of the P channel transistor 54 is connected to the base of a twelfth NPN transistor 58. The collector of the twelfth NPN transistor 58 is connected to $V_{cc}$ and the emitter of the twelfth NPN transistor 5S is connected to the bases of a thirteenth NPN transistor 60, a fourteenth NPN transistor 62 and the base of the eighth NPN transistor 38. The collector of the thirteenth NPN transistor 60 is connected to the base of the twelfth NPN transistor 58 and the emitter of the thirteenth NPN transistor 60 is connected to ground. The collector of the fourteenth NPN transistor 62 is connected to the node 48, and the emitter of the fourteenth NPN transistor 62 is connected to ground.

As can be seen from the circuit diagram of FIG. 1, the voltage at the input node 32 is equal to the voltage at the collector of the fourth NPN transistor 18 (hereinafter $V_{CQ4}$) minus the base-emitter voltages of the sixth and seventh NPN transistors 26 and 30 and the voltage across the resistor 36. Hence, the voltage at the input node 32 can be characterized by the equation:

$$V_{in} = V_{CQ4} - 2V_{be} - V_{RR1} \quad (1)$$

where $V_{be}$ = bipolar base-to-emitter voltage,
$V_{RR1}$ = voltage drop across resistor 36,
$V_{CQ4}$ = Voltage level at the collector of the fourth transistor 18.

Figure 2A:
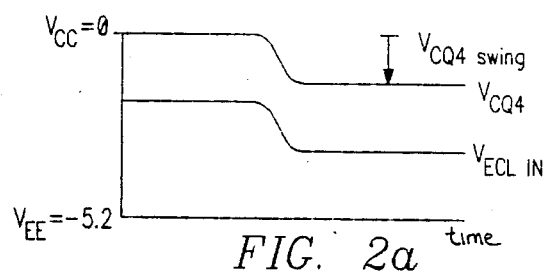
FIGS. 2a-b illustrates a diagram showing the trip point of the CMOS inverter in relation to the ECL voltage swing.

As shown in FIG. 2a, $V_{CQ4}$ tracks the transition of the ECL input voltage. The swing of the collector voltage may be described by the equation:

$$V_{CQ4} \text{ swing} = I_{ec} \times R \quad (2)$$

where $I_{ec}$ = ECL current reference flowing through the fifth resistor 22.

Figure 2B:
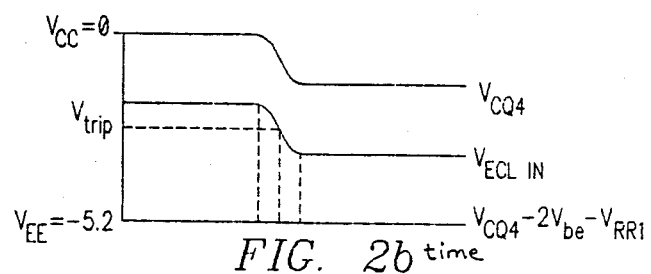

FIG. 2b illustrates the signal at $V_{CQ4}$ undergoing a logic level transition, and the corresponding signal at the node 32, after a voltage drop of $2V_{be} + V_{RR1}$. In order to maximize the speed and noise margin, the voltage at the input node 32 should be at the trip point of the CMOS inverter 34 when $V_{CQ4}$ corresponds to the mid-point of the ECL logic levels. To achieve this correlation between $V_{CQ4}$ and the input node 32, the voltage drop across resistor 36 should be:

$$V_{RR1} = V_{cc} - V_{trip} - 2V_{be} - V_{CQ4\,swing}/2 \quad (3)$$

where $V_{trip}$ = trip point of the CMOS inverter 34.

The current flow through resistor 36 is controlled by the eighth NPN transistor 38. By controlling the current through the resistor 36, the voltage drop across the resistor may be forced to the desired value of equation (3).

The circuit illustrated in FIG. 1 features a current reference 39 labelled CACC (CMOS Amplification Current Conversion), which maintains the proper current through the eighth transistor 38. The CACC performs its function by setting the collector voltage of the resistor 42 to one-half of $V_{CQ4swing}$. This is accomplished by driving the ninth transistor 40 with the same current as the fifth transistor 22, while the resistor 42 has one-half the resistive value of resistor 20. Transistors 44, 46 and 62 of the CACC correspond to the transistors 26, 30 and 38 of the ECL buffer. Resistor 50 has the same resistive value as resistor 36. Hence, the voltage at node 48 equals:

$$V_{node\,48} = V_{cc} - V_{CQ4swing}/2 - 2V_{be} - V_{RR2} \quad (4)$$

The CACC inverter 52 has an identical trip point to the CMOS inverter 34. The output of the CACC inverter 52 is connected to a P channel transistor 54 and an N channel transistor 56 which provides feedback to the node 48 to keep the node at the trip point of the inverter 52. If the output of the inverter 52 is at a logical high, then the P channel transistor 54 will turn off, pulling down the base of the twelfth transistor 58, reducing the current through the fourteenth transistor 62 and, consequently, reducing the current through the eighth transistor 38. The reduction of current through the transistors 62 and 38 will reduce the voltage drop across the respective resistors 48 and 36 thereby increasing the voltage at the nodes 48 and 32 until the input at the CACC inverter 52 is at its trip point. Likewise, if the output of the CACC inverter 52 is a logical low, the P channel transistor 54 will turn on thereby driving current through the twelfth transistor 58 and into the bases of the fourteenth and eighth transistors 62 and 38, decreasing the voltage at the nodes 48 and 32.

The teelfth transistor 58 and the N channel transistor 56 provide current to keep the reference output level stable when connecting to more than one ECL buffer.

Since the voltage at node 48 is forced to $V_{trip}$, equation (4) can be rewritten as:

$$V_{trip} = V_{cc} - V_{CQ4swing}/2 - 2V_{be} - V_{RR2}$$

or $$V_{RR2} = V_{cc} - V_{trip} - 2V_{be} - V_{CQ4swing}/2 \quad (5)$$

Because the current through the fourteenth transistor 62 is equal to the current through the eighth transistor 38, the voltage drop across resistor 36 is equal to the voltage drop across the resistor 50, and the desired results of equation (3) is obtained.

FIG. 3 illustrates a second embodiment of the present invention, with current source labelled BACIT (Bipolar Amplification CMOS Inverter Trip Point). The BACIT current reference circuit differs from the CACC current reference circuit in that the inverter 52 is not connected to the P channel transistor 54, but rather to a differential pair comprising NPN transistors 64, 66 and 68, and P channel transistor 70. The input of the inverter 52 is connected to its output, thus stabilizing the voltage at the base of transistor 64 at $V_{trip}$ of the inverter 52. The collector of the transistor 64 is connected to $V_{cc}$, and the emitter of the transistor 64 is connected to the emitter of transistor 68 and the collector of the transistor 66. The collector of the transistor 68 is connected to the gate and drain of the P channel transistor 70 and to the gates of the P channel transistor 54 and N channel transistor 56. The source of the P channel transistor 70 is connected to $V_{cc}$. The base of the transistor 66 is connected to the ECL current reference 24 and the emitter of the transistor 66 is connected to $V_{EE}$.

In operation, the base of the NPN transistor 64 is set at $V_{trip}$, by virtue of the feedback between the output and input of the inverter 52. If the node 48 has a voltage higher than the base of the transistor 64, then the P channel transistor 54 will be turned on more strongly, thereby increasing the current through transistor 62 and decreasing the voltage at the node 48. The operation of transistors 56, 58 and 60 are the same as in the CACC current reference circuit described in FIG. 1.

FIG. 4 illustrates a variation of the circuits of FIGS. 1 and 3, wherein a transistor 72 is connected in parallel with transistor 26, and has its base connected to a second ECL input 74. In this configuration, the circuit operates as an ECL NOR gate, with a CMOS output.

The present invention provides the technical advantage that the ECL voltages are passed directly to the CMOS inverter, making the circuit very fast. Further-more, the current reference crrcuits of the present invention ensure that the trip point of the CMOS inverter will be set at the center, or another intermediate point, of the voltage swing between logic levels. Thrrefore, the speed of the circuit is maximized as well as the noise margin.

Figure 5:
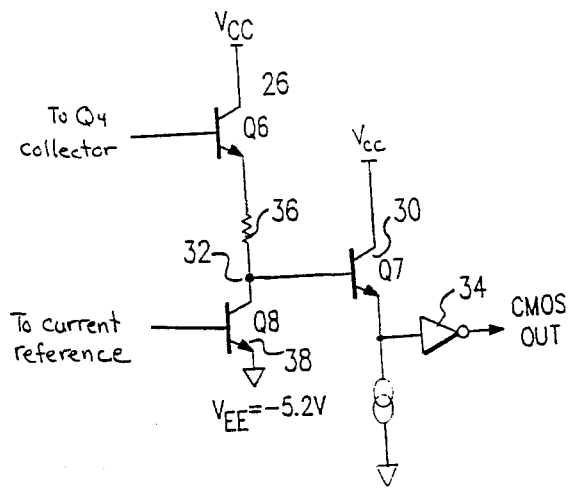
FIGS. 5 and 6 illustrate alternative embodiments of the output section of the ECL-to-CMOS level shifter.
Figure 6:
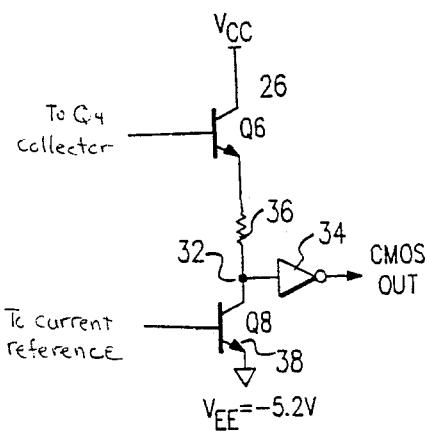

FIGS. 5 and 6 illustrate alternative embodiments which allow a larger inverter 34 to be used, thereby increasing the speed of the level conversion. The circuits of FIGS. 5 and 6 provide a greater current at the input of the inverter 34 without reducing the size of the resistor 36, which would create processing control problems.

In FIG. 5, the collector sixth transistor 26 is connected to a first terminal of the resistor 36. The second terminal of the resistor 36 is connected to the base of the seventh transistor 30 and to the collector of the eighth transistor 38. The collector of the seventh transistor 30 is connected to $V_{cc}$ and the emitter of the seventh transistor 30 is connected to the input of the inverter 34 and to a current source 76.

The circuit of FIG. 5 provides a greater crrrent at the input of the inverter 34, since the voltage at the second terminal of the resistor 36 drives the transistor 30.

In the circuit of FIG. 6, the seventh transistor 30 is removed from the circuit, and therefore the resistor 36 is connected directly to the emitter of the sixth transistor 26. Accordingly, the voltage drop across the resistor 36 will be increased by one $V_{be}$, and the current therethrough will be correspondingly increased.

The modifications of FIG. 5 and 6, if used, should be duplicated in the current reference section in order to maintain the trip point of the inverter 34 in a predetermined position between logic levels.

Although the present invention has been described in detail, it should be understood that various changes, substitutions and alterations can be made herein without departing from the spirit and scope of the invention as defined by the appended claims.

What is claimed is:

1. A voltage level shifter for converting an input signal having first high and low logic levels to an output signal having second high and low logic levels comprising:
   an input node for receiving the input signal;
   an impedance device having first and second terminals, said first terminal operably connected to said input node for providing a voltage drop having a magnitude dependent upon the current through said impedance device;
   a latching device having an input connected to said second terminal of said impedance device and operable to provide said output signal in response to the relative magnitudes of the voltage at the input of said latching device and a predetermined trip voltage of the latching device; and
   a current source for controlling the current through said impedance device such that the voltage at said input of said latching device is equal to said trip voltage when the voltage at said first node is at a predetermined voltage.

2. The level shifter of claim 1 and further comprising a tracking node connected to said input node and responsive to the voltage at said input node, said tracking node connected to said impedance device 3. The level shifter of claim 2 and further comprising:
   a first transistor having its base connected to said input node;
   a second transistor having its base connected to the emitter of the first transistor; and
   a third transistor having its emitter connected to the emitter of said second transistor and collector connected to said tracking node.

4. The level shifter of claim 1 wherein said impedance device comprises a resistor.

5. The level shifter of claim 4 wherein said impedance device further comprises the base-emitter junction of a transistor.

6. The level shifter of claim 4 wherein said impedence device further comprises the base-emitter junctions of a plurality of transistors.

7. The level shifter of claim 1 and further comprising current amplification circuitry connected between said impedance device and said latching device for increasing the current at the input of the latching device.

8. The level shifter of claim 1 wherein said current source comprises:
   a first transistor connected to said impedance device; and
   driving circuitry for controlling the current through said first transistor.

9. The level shifter of claim 8 wherein said driving circuitry comprises:
   a voltage reference means for producing a voltage proportional to the differential between first logic levels;
   a second impedance device having a first terminal connected to said voltage reference means for producing a voltage drop having a magnitude dependent upon the current therethrough:
   a second latching device having a trip voltage corresponding to the trip voltage of said first latching device, said second latching device connected to said second impedance device;
   a second transistor connected to second impedance device for controlling the current therethrough; and
   feedback circuitry for driving said first and second transistors such that voltage at said second terminal of said second impedance device is maintained at approximately said trip voltage of said second latching device.

10. The level shifter of claim 9 wherein said feedback circuitry comprises:
    a P channel transistor having a gate connected to the output of said latching device; and
    an NPN transistor having its base connected to the drain of said P channel transistor and an emitter connected to the bases of said first and second transistors to control the current therethrough.

11. The level shifter of claim 9 wherein said feedback circuitry comprises:
    a pair of transistors having coupled emitters, the input and output of said second latching device being connected to the base of one of said pair of transistors and the second terminal of said second impedance device connected to the base of the other of said pair of transistors;
    a P channel transistor having a gate connected to the collector of said other of said pair of transistors; and
    an NPN transistor having its base connected to the drain of said P channel transistor and an emitter connected to the bases of said first and second transistors to control the current therethrough.

12. The level shifter of claim 1 wherein said latching device is an inverter.

13. A method of shifting an input signal corresponding to a first set of logic levels to an output signal corresponding to a second set of logic levels, comprising the steps of:
generating a voltage reference having a predetermined relationship to the differential between the high and low logic levels of the first set.
generating a first voltage equal to the voltage of the input signal adjusted by a voltage drop over a first impedance device, the voltage drop being dependent upon the magnitude of current through said impedance device;
generating a second voltage equal to the voltage of said voltage reference adjusted by a voltage drop over a second impedance device, the voltage drop being dependent upon the magnitude of current through said second impedance device;
adjusting said current through said second impedance device such that said second voltage is equal to the trip voltage of a first latching device connected to said second impedance device;
adjusting the current through said first impedance device in a predetermined ratio to the current through said second impedance device, such that the first voltage is equal to the trip point of a second latching device when the level of the signal is at a voltage between the first set of high and low voltage levels; and
generating the output signal at the output node of said second latching device.

14. The method of claim 13 wherein said step of generating a first voltage comprises the steps of:
connecting the signal to a first terminal of an impedance device; and
controlling the voltage drop across the impedance device by regulating current therethrough.

15. The method of claim 14 wherein said step of controlling the voltage drop comprises the steps of:
connecting an adjustable current source to a second terminal of said first impedance device; and
regulating the current generated by said current source.

16. The method of claim 15 wherein said step of connecting an adjustable current source comprises the step of connecting a transistor to the second terminal of said first impedance device.

17. The method of claim 13 wherein said step of adjusting said current through said second impedance device comprises the steps of:
comparing the voltage at the input of said first latching device to the trip point of said first latching device;
increasing the current through said impedance device if said input voltage is greater than said trip point; and
decreasing the current through said second impedance device if said input voltage is less than said trip point.

18. The method of claim 13 wherein said step of adjusting the current through said first impedance device comprises the step of driving first and second transistors connected to said first and second impedance devices such that the current conducted through the respective transistors is in a predetermined ratio.

19. A method of converting an input signal having first high and low logic levels to an output signal having second high and low logic levels, comprising the steps of:
generating a voltage reference at a first node having a predetermined relationship to the differential between the first high and low logic levels;
generating a first current level through a first impedance device connected to a first latching device to cause a voltage drop across said first impedance device:
generating a second current level having a predetermined relationship to said first current level through a second impedance device connected between said first node and a second node;
comparing the voltage at said second node to the trip point of a second latching device; and
adjusting said first and second current level such that the voltage at said second node is approximately equal to the trip point of said second latching device.

20. The method of claim 19 and further comprising the step of generating a voltage at a second node equal to the voltage of the input signal shifted by a predetermined voltage, said first impedance device connected between said second node and the input to said first latching device.

* * * * *